(12) United States Patent
Liao et al.

(10) Patent No.: US 7,686,620 B2
(45) Date of Patent: Mar. 30, 2010

(54) ELECTRICAL CONNECTOR CONFIGURED BY UNIT SECTION

(75) Inventors: Fang-Jwu Liao, Tu-cheng (TW);
Chun-Yi Chang, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/316,226

(22) Filed: Dec. 10, 2008

(65) Prior Publication Data
US 2009/0280659 A1    Nov. 12, 2009

(30) Foreign Application Priority Data
May 7, 2008    (CN) ............................... 097207848

(51) Int. Cl.
*H01R 12/00* (2006.01)
(52) U.S. Cl. ......................................................... 439/71
(58) Field of Classification Search .................. 439/71, 439/69–70
See application file for complete search history.

(56) References Cited

U.S. PATENT DOCUMENTS

| | | | |
|---|---|---|---|
| 6,679,707 B1 | 1/2004 | Brodsky et al. | |
| 6,881,073 B2 | 4/2005 | Bali et al. | |
| 6,971,887 B1 * | 12/2005 | Trobough | 439/71 |
| 7,473,106 B2 * | 1/2009 | Liao et al. | 439/71 |

* cited by examiner

*Primary Examiner*—Jean Duverne
(74) *Attorney, Agent, or Firm*—Andrew C. Cheng; Wei Te Chung; Ming Chieh Chang

(57) ABSTRACT

An electrical connector for electrically connecting an integrated circuit package to a circuit substrate includes a first and a second unit sections, and each unit section has a number of terminals received therein. Each unit section includes a mating surface, an opposed mounting surface, a fixing edge, and an engaging edge. The engaging edge of the first unit section has a protruding tongue, and the engaging edge of the second unit section defines a recessed portion for engaging the protruding tongue. An interlocking device is formed between the protruding tongue and the recessed portion, so that the protruding tongue is capable of overlapping and combined with the recessed portion via the interlocking device to make the first and the second unit sections become a unitary structure.

16 Claims, 4 Drawing Sheets

ELECTRICAL CONNECTOR CONFIGURED BY UNIT SECTION

BACKGROUND OF THE INVENTION

1. Field of the Invention

In general, the present invention relates to the art of electrical connectors. Specifically, the present invention provides an electrical connector configured by unit sections that are interconnected with each other by interlocking devices.

2. Background of the Invention

Generally, a conventional connector to which the present invention is related is interposed between a first and a second electronic parts or components having contact pads, respectively, to achieve electrical connection between the first and the second electronic components. In the following description, the first and the second electronic parts or components are a printed circuit board and a Large Scale Integrated circuit (LSI), respectively. The connector comprises an insulator provided with a plurality of contact receptacle holes penetrating the insulator in a thickness direction, and a plurality of elastic contacts and inserted into and held in the contact receptacle holes, respectively.

However, in the conventional electrical connectors, housings are usually molded by an injected art.

As a result, when the connector is formed, contacts are inserted in passageways defined on the housing of the electrical connector. In addition, when an industry trend is to obtain highest quantity of contacts on the electrical connector, the housing of the electrical connector needs receive more terminals therein for getting a better electrical connection and transmitting more signals, so much passageways are formed on the housing, correspondingly that leads the housing difficultly to mold, such as insulative material can not fill fully of moulds.

Heretofore, various electrical connectors have been developed for interconnecting IC package to the Printed Circuit Board (PCB). However, previous attempts in forming higher density electrical connector met much difficulties resulted from uneven distribution of material flow and shrinkages, problems that were magnified as the housing/array of the contacts became larger.

U.S. Pat. No. 6,679,707 issued to Brodsky on Jan. 20, 2004 and U.S. Pat. No. 6,881,073 issued to Glen Ellyn both disclose a modular electrical connector formed from several smaller sections, each including interconnecting edges for joining with another the sections together. Configuring the electrical connector by interconnecting the smaller sections together, the electrical connector having maximum quantity of contacts can be easily provided. The electrical connector disclosed by Brodsky or Glen Ellyn is a good concept but not a most suitable way. Moreover, the electrical connector also needs a frame for fixing the sections to be a unitary structure, thus it is more complicated to manufacture the electrical connector.

In view of the above, it is strongly desired to provide an improved electrical connector to overcome the above-mentioned disadvantage.

SUMMARY OF THE INVENTION

Accordingly, an object of the present invention is to provide an electrical connector for increasing the number of the contacts thereof.

To achieve the above-mentioned object, in a preferred embodiment of the present invention, the present invention provides an electrical connector, for electrically connecting an integrated circuit package to a circuit substrate, comprises a first and a second unit sections, wherein each unit sector has a plurality of terminals received therein. In addition, each unit section includes a mating surface, an opposed mounting surface, a fixing edge, and an engaging edge. The engaging edge of the first unit section defines a protruding tongue, and the engaging edge of the second unit section defines a recessed portion for engaging the protruding tongue from another unit section. Specially, an interlocking device are formed between the protruding tongue and the recessed portion, so that the protruding tongue is capable of overlapping and combined with the recessed portion via the interlocking device to make the first and the second unit sections become a unitary structure.

BRIEF DESCRIPTION OF THE DRAFLANGES

DETAILED DESCRIPTION OF THE PREFERRED EMBODIMENT OF THE INVENTION

A preferred embodiment of the present invention will be described hereunder with reference to the accompanying drawings FIG. 1-FIG. 3.

Figure 1:
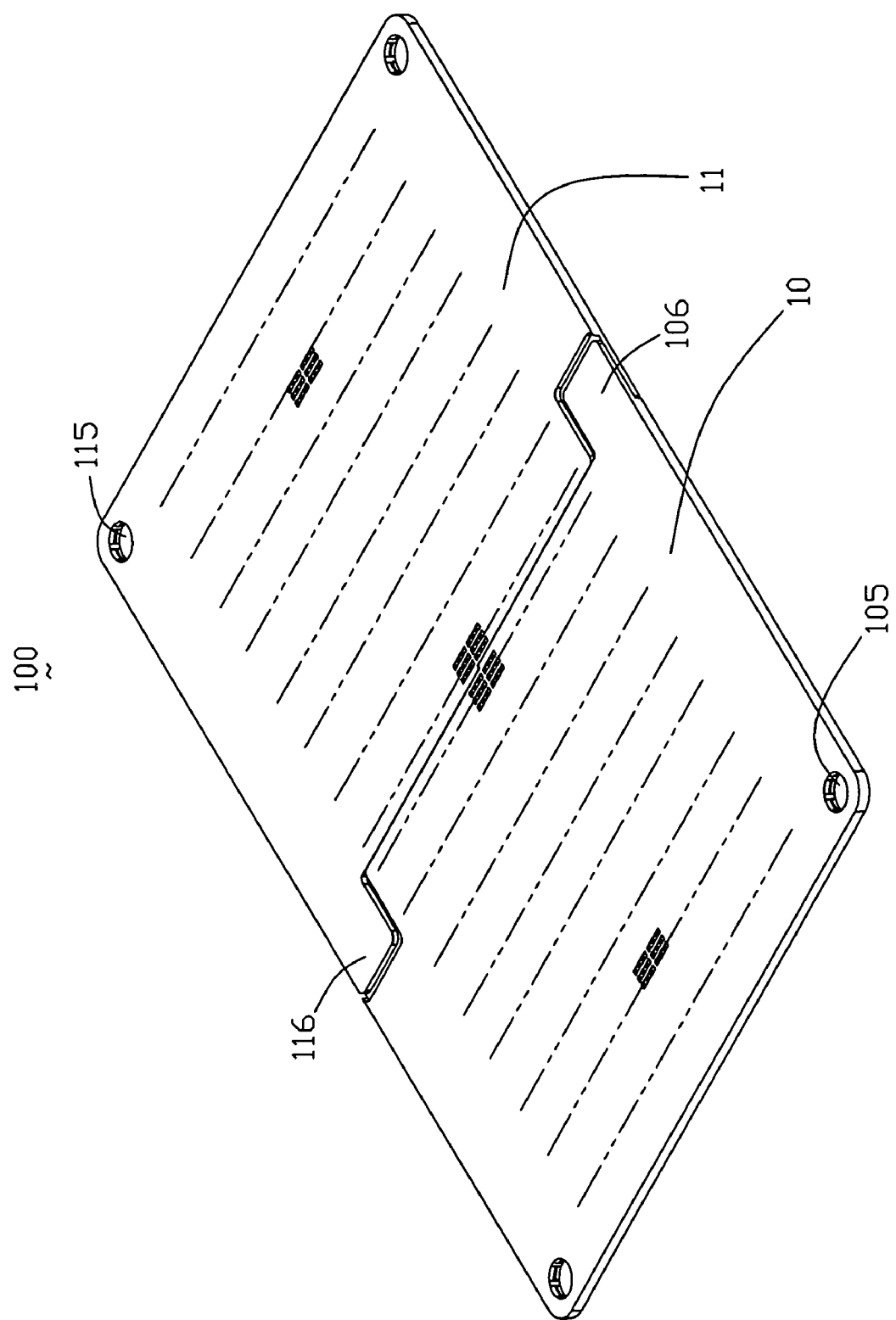
FIG. 1 is an assembled, perspective view of an electrical connector in accordance with a preferred embodiment of the present invention.
Figure 2:
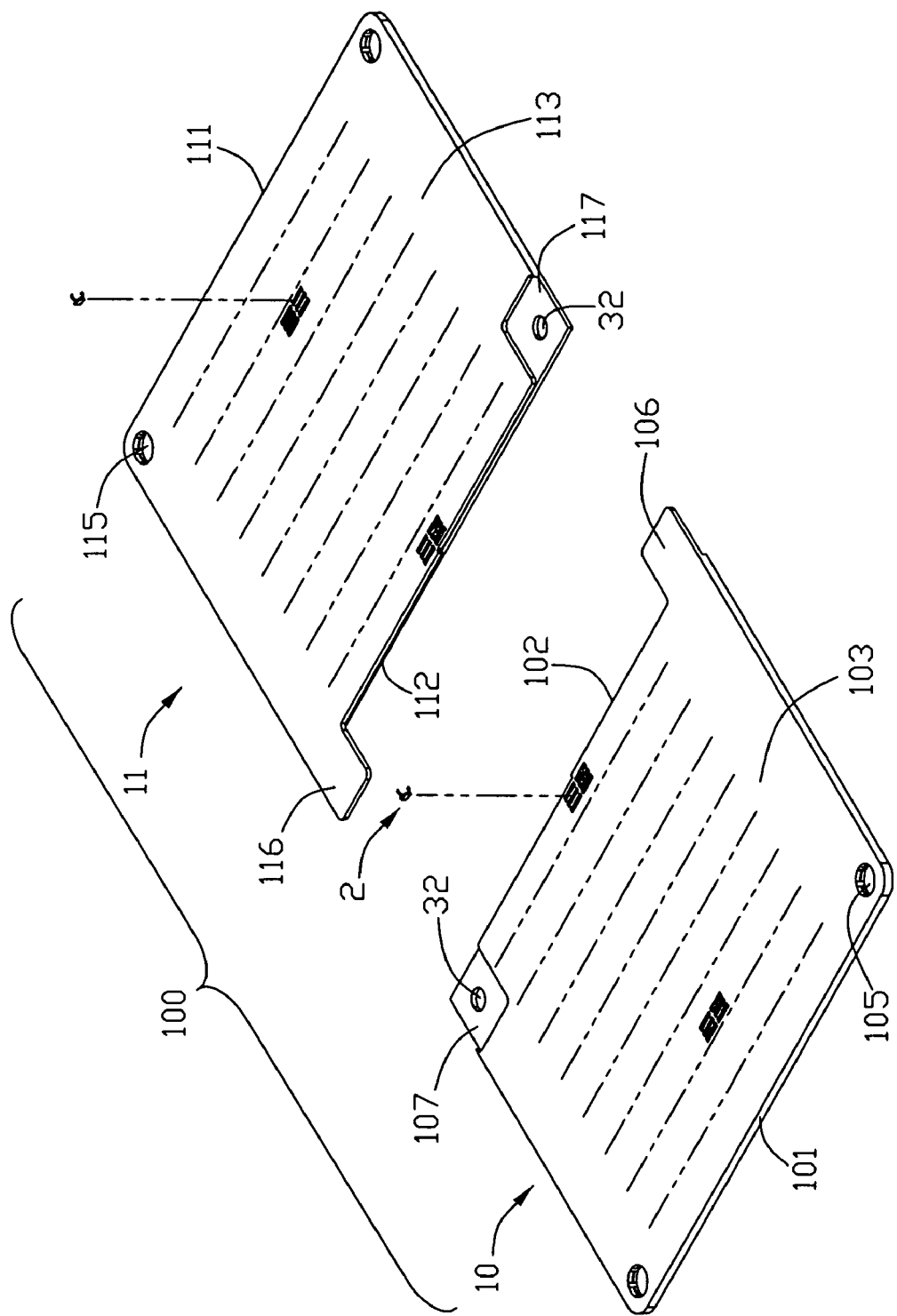
FIG. 2 is an exploded, perspective view of FIG. 1.

Referring to FIGS. 1 and 2, an electrical connector 100, for electrically interconnecting an integrated circuit (IC) package (not shown) with a printed circuit board (PCB) (not shown), according to the present invention is shown. As depicted, the electrical connector 100 includes two unit sections 10 and 11. Each unit section 10, 11 receives a plurality of terminals 2.

Figure 3:
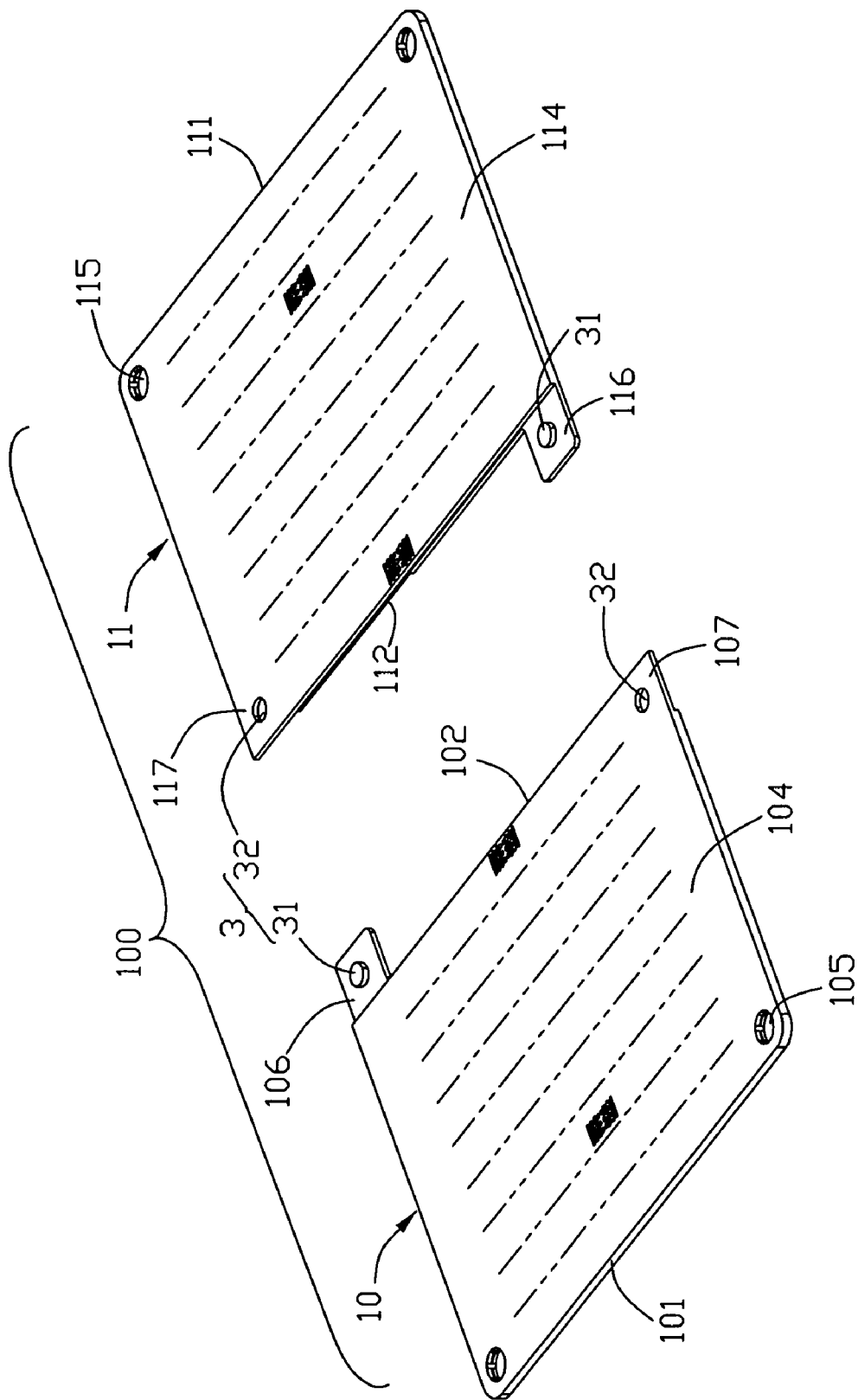
FIG. 3 is similar to FIG. 2, but viewed from another aspect.
Figure 4:
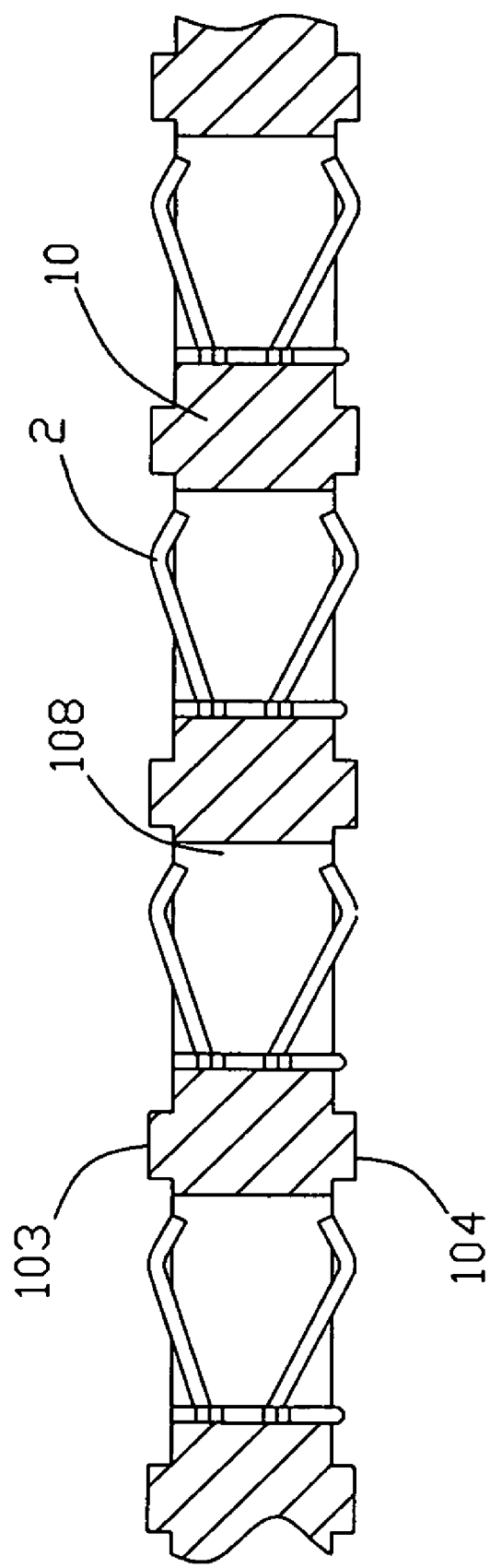
FIG. 4 is a partial cross-section view of the first section of the electrical connector illustrating the terminals received therein.

Referring now to FIGS. 2-4 the unit sections 10, 11 are configured a substantially rectangular shape and are formed from one mold. The unit section 11 includes a fixing edge 101, an opposite engaging edge 102, a mating surface 103 and an opposed surface 104. A plurality of passageways 108 are disposed through the mating surface 103 to the mounting surface 104 for accommodating the terminals 2, respectively. The fixing edge 101 defines two through holes 105 at two ends thereof. One end of the engaging edge 102 defines a protruding tongue 106 and the other end defines a recessed portion 107. The protruding tongue 106 has a substantially rectangular shape, and is coplanar with the mating surface 103 and extends downwardly and partially towards the mounting surface 104. The recessed portion 107 is also configured as a rectangular shape, and is recessed from the mating surface 103 and coplanar with the mounting surface 104.

Obviously, same to the unit section 10, the unit section 11 includes a fixing edge 111, an engaging edge 112 adjacent to the engaging edge 102 of the unit section 10, a mating surface 113 and a mounting surface 114. Two through holes 115 are defined at two ends of the fixing edge 111, respectively. One end of the engaging edge 112 defines a protruding tongue 116 engaging the corresponding recessed portion 107 of the unit section 10 and the other end defines a recessed portion 117 engaging the corresponding protruding tongue 106 of the unit section 10.

Referring now to FIG. 3, the electrical connector 100 further includes two interlocking devices 3 formed between the unit sections 11, 12 to assemble the two unit sections 11, 12 to a unitary structure. In the preferred embodiment of the present invention, the interlocking device 3 are formed by a post 31 of one unit section and a hole 32 of the other unit section, the posts 31 is defined on the protruding tongue 106, 116 and the holes 32 are defined on the recessed portions 106, 116, respectively.

Turning now to FIGS. 1 and 3, in assembling the electrical connector 100, the terminals 2 are firstly arranged into the unit sections 10, 11, and then the two unit sections 10, 11 are formed together via the interlocking devices 3. In addition, the protruding tongues 106, 116 are overlapped and interconnected with the corresponding recessed portion 117, 107, respectively. Moreover, the posts 31 on the protruding tongues 106, 116 are inserted and riveted into the corresponding hole 32 in the recessed portion 117, 107, respectively. Thus, the two unit sections 10, 11 are formed into a unitary structure and the electrical connector 100 is assembled successfully. Now, the electrical connector 100 can be mounted on the PCB (not shown) by four pins (not shown) through the through holes 105, 115, respectively.

It is noted that, in the preferred embodiment, the two unit sections 10, 11 are typically formed from one mold, and the unit sections 10, 11 can be identical. One of the two unit sections 10, 11 only need to rotate 180° to face the other section, so that the protruding tongue and the recessed portion can be interconnected. Moreover, the unit sections 10, 11 are not limited at two, and other number unit sections are also permitted. When the electrical connector are formed by a plurality of unit sections more than two, each section includes a plurality of engaging edges, and each engaging edge defines a protruding tongue and a recessed portion. The protruding tongue of one unit section is adapted to engage the corresponding recessed portion of another adjacent one of the plurality of unit sections and interlocked with the recessed portion by an interlocking device to make the plurality of unit sections become a unitary structure.

Although the present invention has been described with reference to the accompanying drawings, it is not to be construed as being limited thereto. Various alterations and modifications can be made to the embodiments without in any way departing from the scope or spirit of the present invention as defined in the appended claims. Such modifications and alterations that may be apparent to a person skilled in the art are intended to be included within the scope of this invention as defined in by the accompanying claims.

What is claimed is:

1. An electrical connector, for electrically connecting an integrated circuit package to a circuit substrate, comprising:
a first and a second unit sections, each unit section having a plurality of terminals received therein and including a mating surface, an opposite mounting surface, a fixing edge, and an engaging edge, the engaging edge of the first unit section defining a protruding tongue, and the engaging edge of the second unit section defining a recessed portion for engaging the protruding tongue from another unit section; and
an interlocking device formed between the protruding tongue and the recessed portion, so that the protruding tongue capable of substantially overlapping and combined with the recessed portion via the interlocking device to make the first and the second unit sections become a unitary structure; a pair of identical units head to head engaged with each other around corresponding joint edges in a horizontal direction, each of said units including an insulative planar housing with a plurality of terminals therein, said housing defining around said joint edge an upward engagement section on one side while with a downward engagement section on an opposite side under condition that one of said upward engagement section and said downward engagement section protrudes beyond the corresponding joint edge and the other is recessed behind the corresponding joint edge so that when the pair of units are engaged with each other, the upward engagement section of one of said pair of units engages the downward engagement section of the other, and the downward engagement section of said one of the pair of units engages with the upward engagement section of the other so as to prevent relative movement between said pair of units in a vertical direction, and said one of said upward engagement section and said downward engagement section protruding beyond the corresponding joint edge engages the other units in a lateral direction prevents relative movement between the pair of units in a lateral direction perpendicular to said vertical direction.

2. The electrical connector as claimed in claim 1, wherein the interlocking device are formed from a post and a corresponding hole, the post is disposed on one of the protruding tongue and the recessed portion, and the hole is defined in the other for receiving the post.

3. The electrical connector as claimed in claim 2, wherein the protruding tongue of the first unit section is coplanar with the mating surface and extends partially towards the mounting surface, the recessed portion of the second unit section is coplanar with the mounting surface and recessed from the mating surface.

4. The electrical connector as claimed in claim 3, wherein the mating surfaces and mounting surfaces of the first and second unit sections are coplanar with each other respectively when the protruding portion engages the recessed portion.

5. The electrical connector as claimed in claim 3, wherein the engaging edge of the first unit section further defines another recessed portion, the engaging edge of the second unit section further defines another protruding tongue engaging the corresponding recessed portion of the first unit section.

6. The electrical connector as claimed in claim 4, wherein the first and the second unit sections can be formed from one mold.

7. The electrical connector as claimed in claim 1, wherein the fixing edges of the first and second unit sections define through holes on two ends thereof, respectively, adapted to be mounted on the circuit substrate by pins through the through holes.

8. The electrical connector as claimed in claim 1, wherein each of the first and the second unit sections define a plurality of passageways disposed from the mating surface to the corresponding mounting surface, the plurality of terminals are received in the passageways, respectively.

9. An electrical connector, comprising:
a plurality of unit sections, each section having a plurality of terminals received therein and including a plurality of engaging edges, each engaging edge defining a protruding tongue and a recessed portion, the protruding tongue of one unit section adapted to engage the corresponding recessed portion of another adjacent one of the plurality of unit sections; and
a plurality of interlocking devices, each interlocking device formed between the protruding tongue of one unit section and the corresponding recessed portion of another adjacent one of the plurality of unit sections, so that the protruding tongue can be overlapped and combined with the corresponding recessed portion via the interlocking device to make the plurality of unit sections become a unitary structure.

10. The electrical connector as claimed in claim 9, wherein the interlocking device are formed from a post and a corresponding hole, the post is disposed on one of the protruding tongue and the recessed portion, and the hole is defined in the other for receiving the post.

11. The electrical connector as claimed in claim 10, wherein each unit section further includes a mating surface and an opposite mounting surface, the protruding tongue is coplanar with the mating surface and extends partially towards the mounting surface, the recessed portion is coplanar with the mounting surface and recessed from the mating surface.

12. The electrical connector as claimed in claim 11, wherein the mating surfaces and mounting surfaces of adjacent unit sections are coplanar with each other respectively when the plurality of unit sections are formed into a unitary structure.

13. The electrical connector as claimed in claim 9, wherein each of the unit sections can be formed one mold and then rotated to interconnect with each other.

14. The electrical connector as claimed in claim 9, wherein each of the unit sections further includes a fixing edge, the fixing edge defines through holes on two ends thereof, respectively, adapted to be mounted on the circuit substrate by pins through the through holes.

15. The electrical connector as claimed in claim 1, wherein said upward engagement section and the downward engagement section of the same unit are respectively located at two opposite sides of the housing in said lateral direction.

16. The electrical connector as claimed in claim 1, wherein one of said upward engagement section and the downward engagement section of the same unit defines a post extending along the vertical direction, and the other defines a hole in said vertical direction compliantly so that the hole of the unit receives the post of the other unit for prevent relative movement between the pair of units in a front-to-back direction perpendicular to both said vertical direction and said lateral direction.

* * * * *